(12) United States Patent
Shekhar et al.

(10) Patent No.: US 11,437,294 B2
(45) Date of Patent: Sep. 6, 2022

(54) STRUCTURES TO FACILITATE HEAT TRANSFER WITHIN PACKAGE LAYERS TO THERMAL HEAT SINK AND MOTHERBOARD

(71) Applicant: Intel Corporation, Santa Clara, CA (US)

(72) Inventors: Sameer Shekhar, Portland, OR (US); Amit Kumar Jain, Portland, OR (US); Kaladhar Radhakrishnan, Chandler, AZ (US); Jonathan P. Douglas, Portland, OR (US); Chin Lee Kuan, Pahang (MY)

(73) Assignee: Intel Corporation, Santa Clara, CA (US)

( * ) Notice: Subject to any disclaimer, the term of this patent is extended or adjusted under 35 U.S.C. 154(b) by 881 days.

(21) Appl. No.: 16/059,513

(22) Filed: Aug. 9, 2018

(65) Prior Publication Data
US 2020/0051884 A1  Feb. 13, 2020

(51) Int. Cl.
*H01L 23/367* (2006.01)
*H01L 23/498* (2006.01)
*H01L 23/522* (2006.01)
*H01L 23/00* (2006.01)
*G06F 1/20* (2006.01)

(52) U.S. Cl.
CPC .......... *H01L 23/367* (2013.01); *G06F 1/206* (2013.01); *H01L 23/49822* (2013.01); *H01L 23/5226* (2013.01); *H01L 23/5227* (2013.01); *H01L 24/09* (2013.01); *H01L 24/17* (2013.01)

(58) Field of Classification Search
CPC .......... H01L 23/367; H01L 23/49822; H01L 23/5226; H01L 23/5227; H01L 24/09; H01L 24/17; G06F 1/206
USPC ........................................... 257/531
See application file for complete search history.

(56) References Cited

U.S. PATENT DOCUMENTS

2020/0027908 A1* 1/2020 Paul .................. H01L 27/13

* cited by examiner

*Primary Examiner* — Tu-Tu V Ho
(74) *Attorney, Agent, or Firm* — Schwabe, Williamson & Wyatt P.C.

(57) ABSTRACT

Embodiments disclosed herein include electronics packages with improved thermal pathways. In an embodiment, an electronics package includes a package substrate. In an embodiment, the package substrate comprises a plurality of backside layers, a plurality of front-side layers, and a core layer between the plurality of backside layers and the plurality of front-side layers. In an embodiment, an inductor is embedded in the plurality of backside layers. In an embodiment, a plurality of bumps are formed over the front-side layers and thermally coupled to the inductor. In an embodiment, the plurality of bumps are thermally coupled to the core layer by a plurality of vias.

25 Claims, 12 Drawing Sheets

US 11,437,294 B2

1

STRUCTURES TO FACILITATE HEAT TRANSFER WITHIN PACKAGE LAYERS TO THERMAL HEAT SINK AND MOTHERBOARD

TECHNICAL FIELD

Embodiments of the disclosure are in the field of electronics packaging and, in particular, to structures that provide improved heat transfer away from embedded inductors or any other heat source in a package substrate.

BACKGROUND

Due to increased CPU currents, power dissipated due to conduction loss in package integrated inductors for integrated voltage regulators (IVRs) is causing local package substrate temperature to exceed reliability limits. Power from these air core inductors (ACIs) is dissipated in all of the traces of the ACIs including the backside package layers. The heat path from the inductor is up through the front-side layers of the package to bumps (e.g., C4 bumps), and ultimately to the die and any thermal solution attached to the die. However, the thermal pathway has a high thermal resistance due to high thermal resistivity of the organic material in the package substrate. As such, the inductor is not able to transfer heat adequately. An ACI operating in a package, therefore, has a finite capacity to carry current at a given maximum substrate temperature. If the temperature of the substrate is lowered, the ACIs can carry more current. This improved current capacity will allow for systems to have improved performance.

2

Figure 5A:
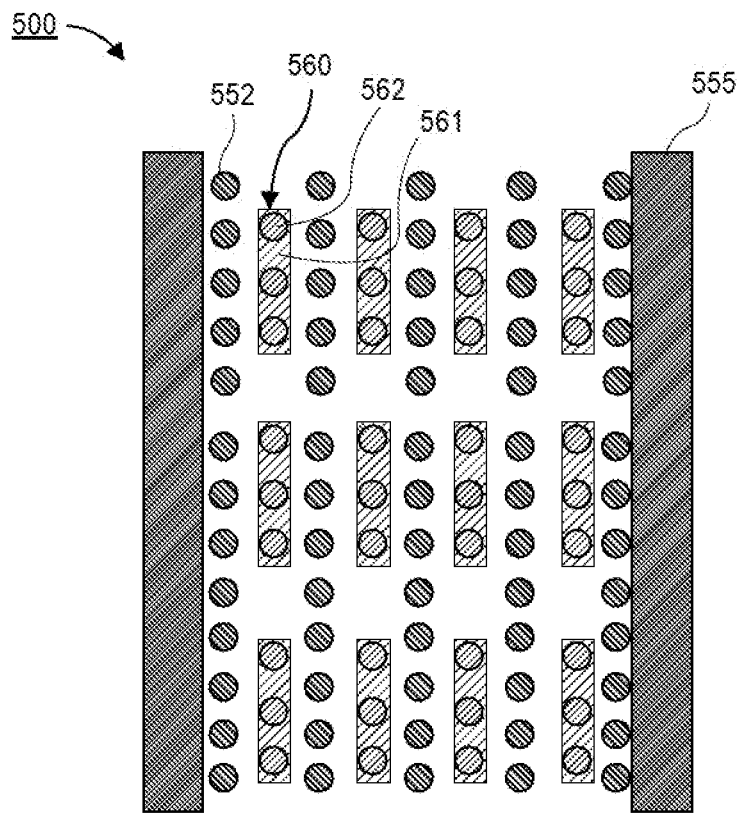
FIG. 5A is a plan view illustration of a top surface of a package with a plurality of linear power bump (e.g., $V_{CC}$ bumps) groups, in accordance with an embodiment.
Figure 5B:
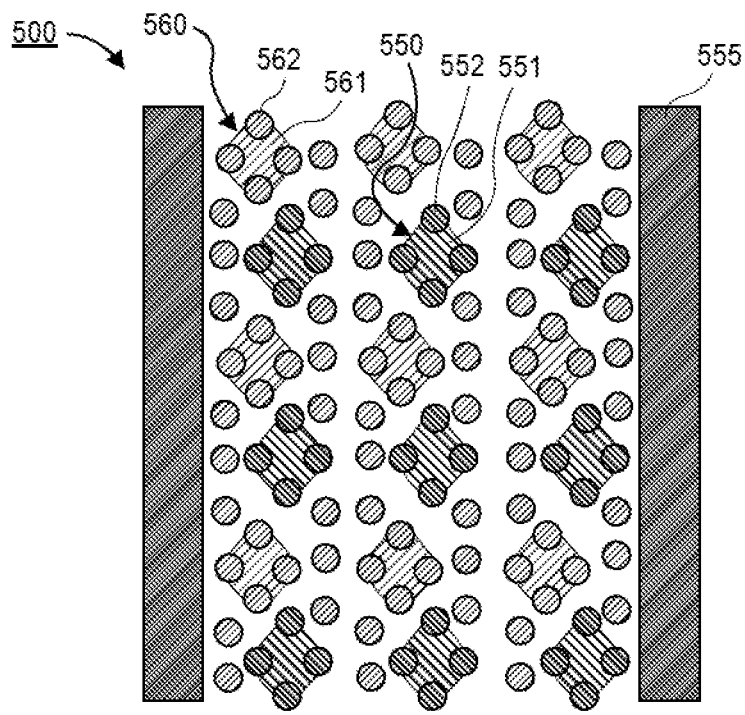

FIG. 5B is a plan view illustration of a top surface of a package with a plurality of power bump (e.g., $V_{CC}$ bumps) groups and a plurality of ground bump (e.g., $V_{SS}$ bumps) groups, in accordance with an embodiment.

Figure 5C:
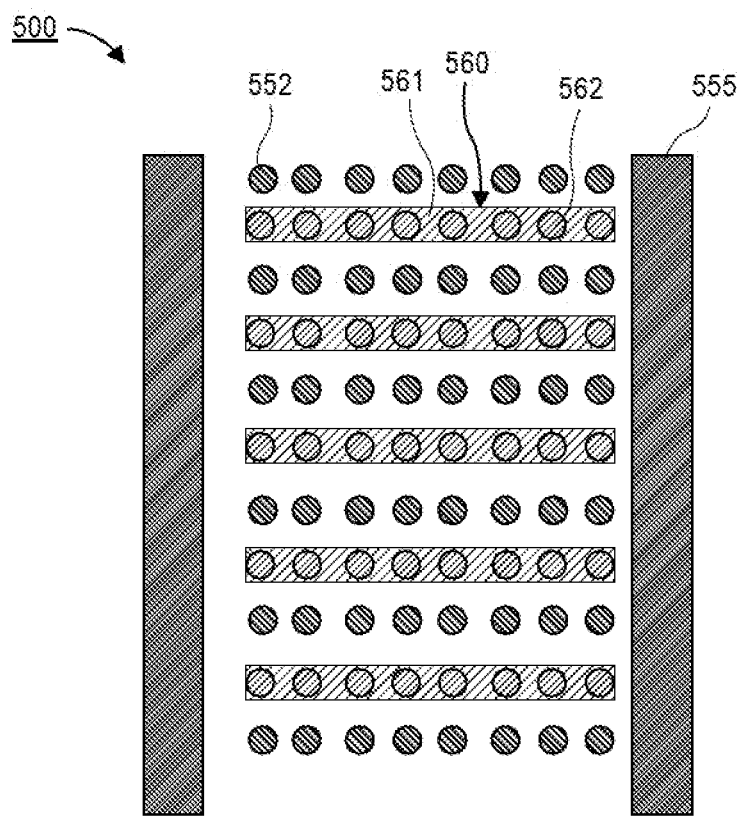

FIG. 5C is a plan view illustration of a top surface of a package with a plurality of linear power bump (e.g., $V_{CC}$ bumps) groups, where the power bump (e.g., $V_{CC}$ bumps) groups are oriented perpendicular to the IVR hard intellectual property (HIP), in accordance with an embodiment.

Figure 5D:
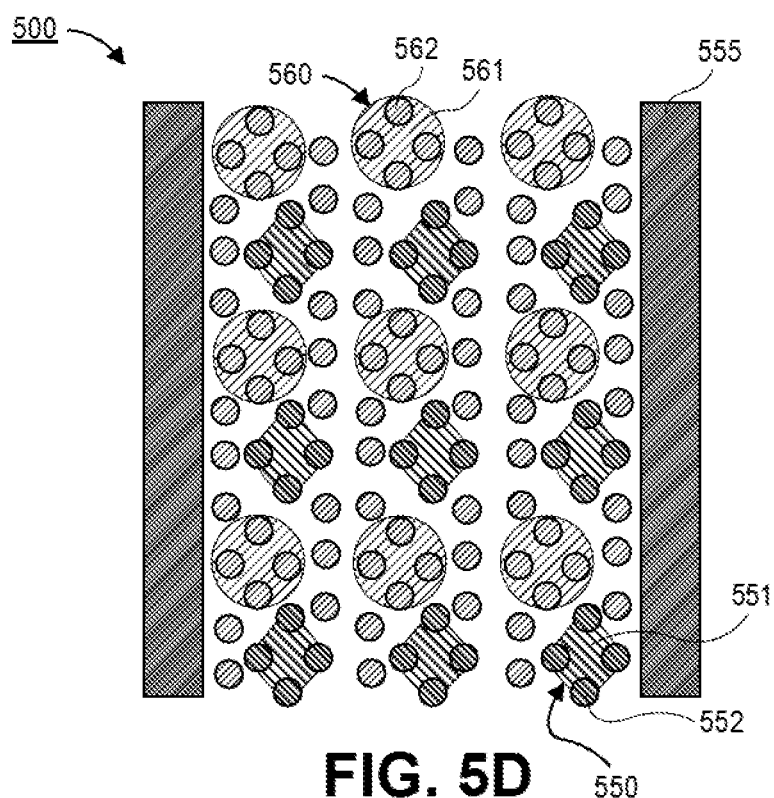

FIG. 5D is a plan view illustration of a top surface of a package with a plurality of power bump (e.g., $V_{CC}$ bumps) groups and a plurality of ground bump (e.g., $V_{SS}$ bumps) groups, in accordance with an additional embodiment.

Figure 6A:
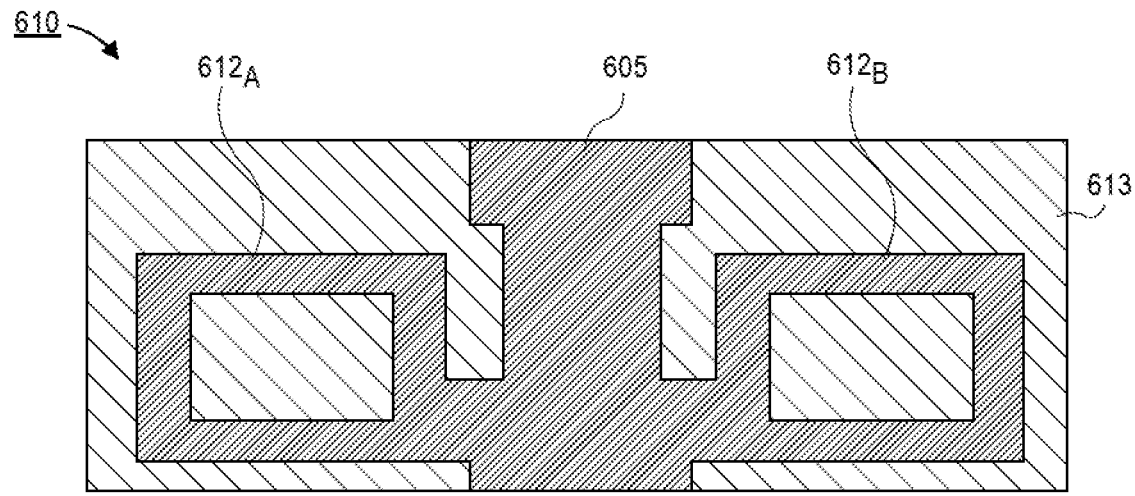

FIG. 6A is a plan view illustration of a bottom surface of a package substrate that shows the inductors, in accordance with an embodiment.

Figure 6B:
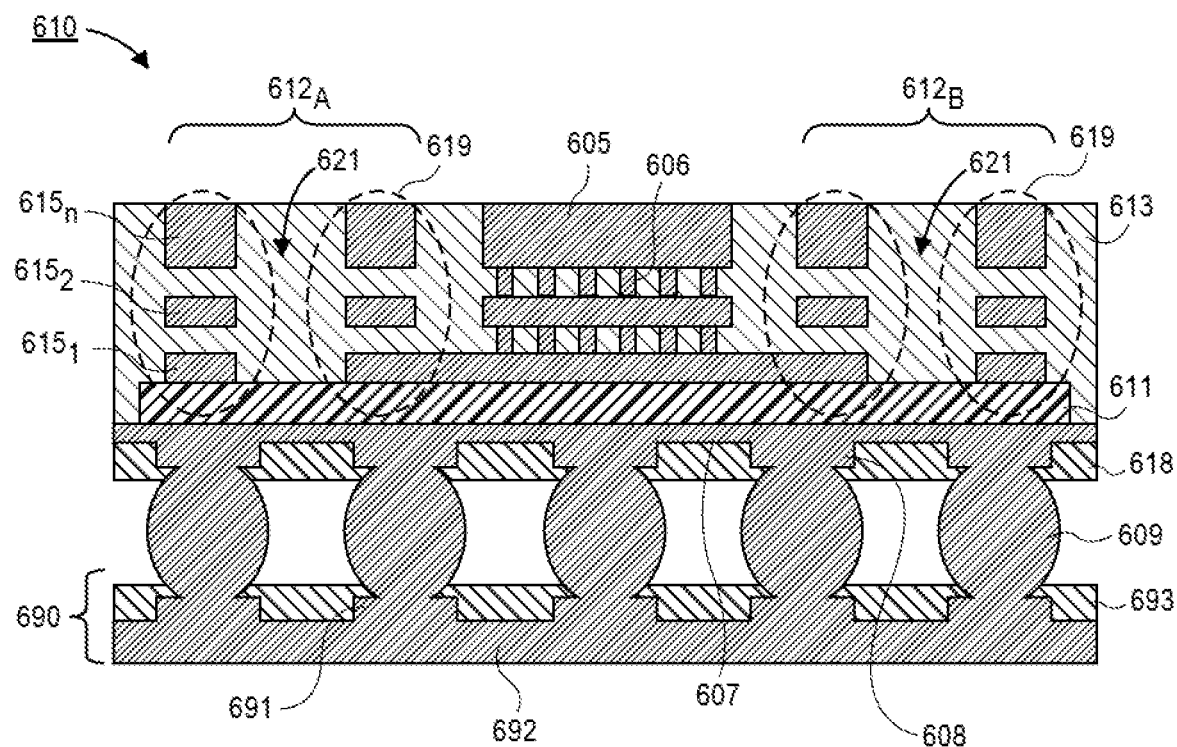

FIG. 6B is a cross-sectional illustration of the backside layers of a package substrate that includes a plurality of inductors and a magnetic block below the inductors that is thermally coupled to a board, in accordance with an embodiment.

Figure 7:
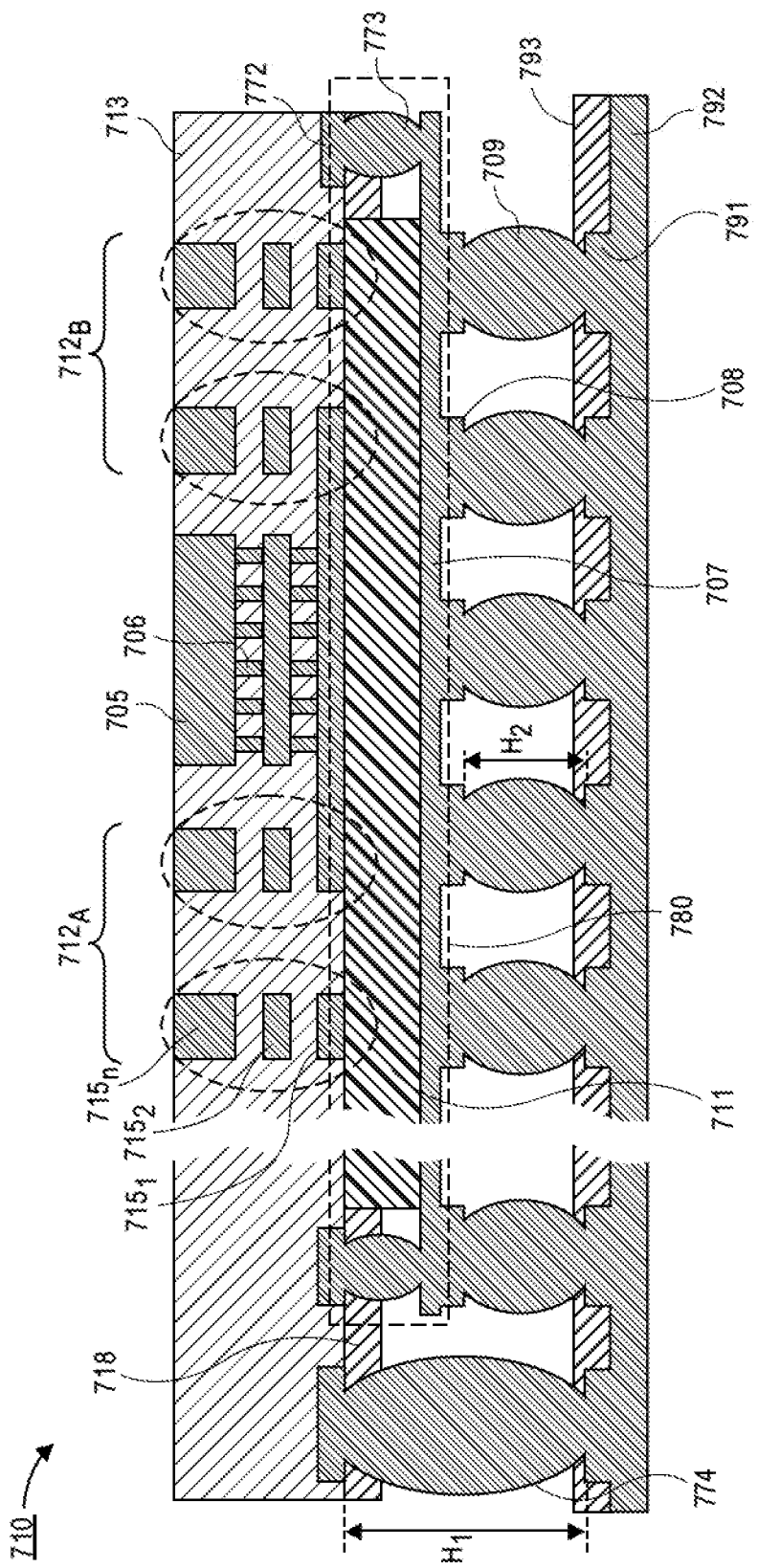

FIG. 7 is a cross-sectional illustration of the backside layers of a package substrate with a discrete thermal path below the inductors, where the thermal path is coupled to the package substrate and to a board, in accordance with an embodiment.

Figure 8A:
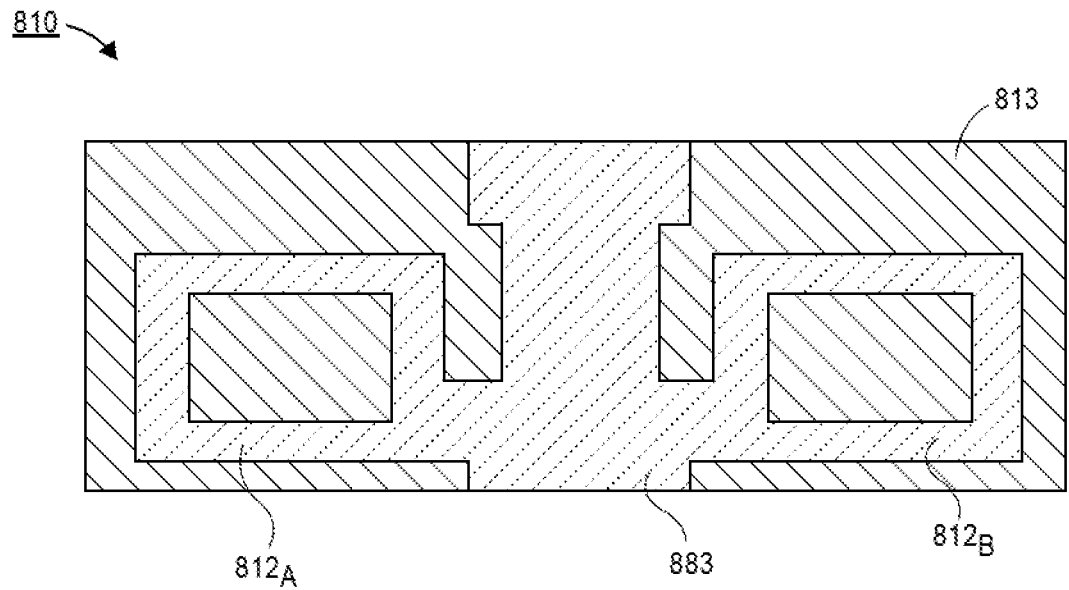

FIG. 8A is a plan view illustration of the backside surface of a package substrate that includes a plurality of inductors and a thermal sink over the plurality of inductors, in accordance with an embodiment.

Figure 8B:
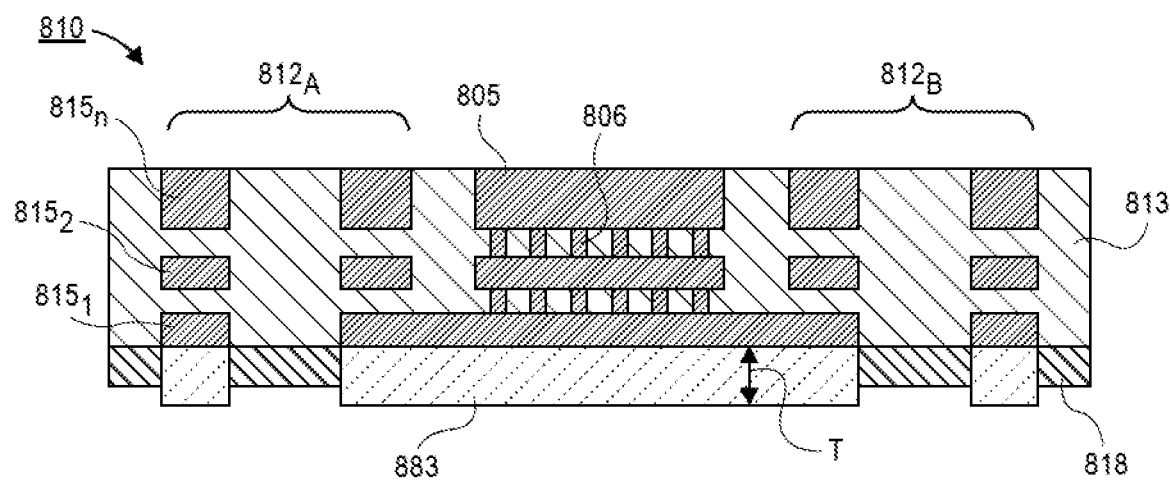

FIG. 8B is a cross-sectional illustration of the backside layers of a package substrate that illustrates the thermal sink coupled to the inductors, in accordance with an embodiment.

Figure 9:
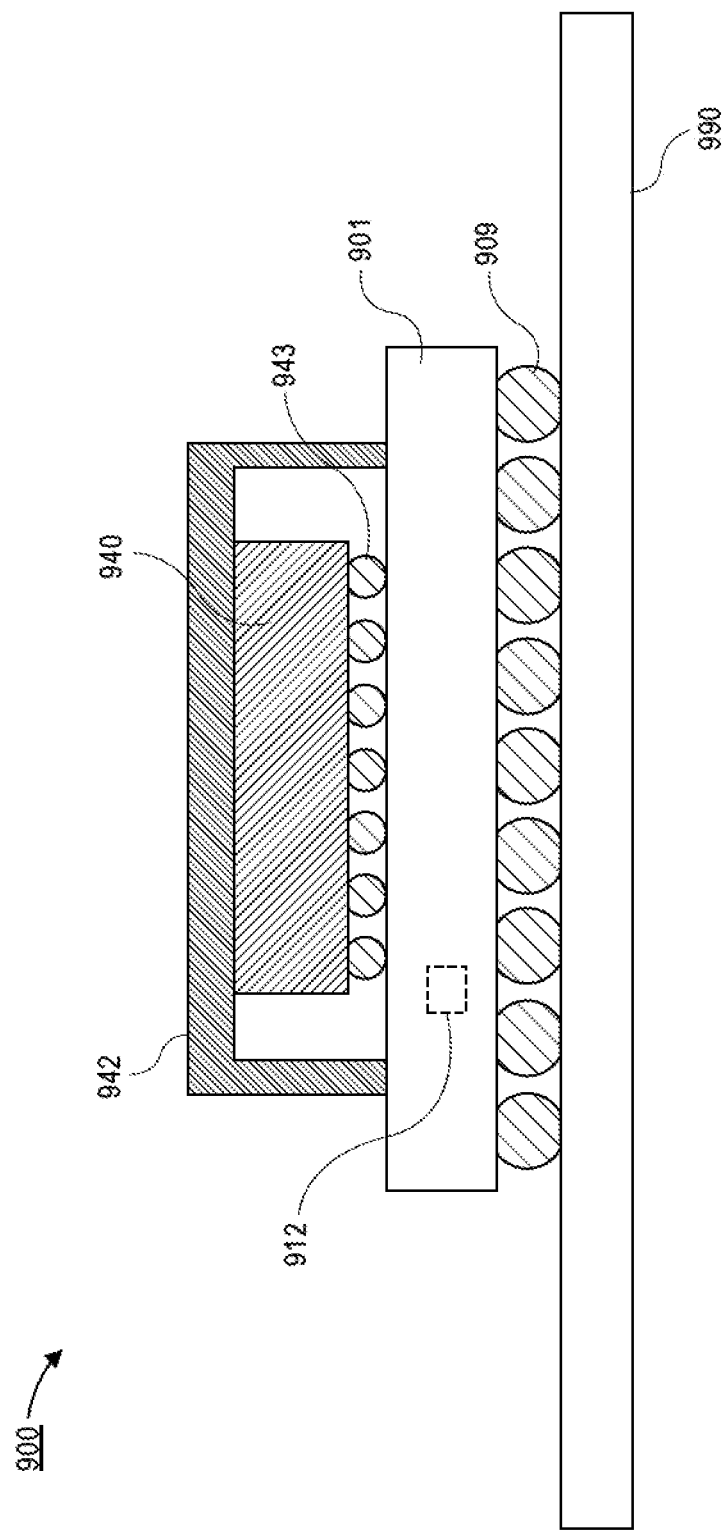

FIG. 9 is a schematic illustration of an electronics system that comprises thermal pathways to cool inductors in the package substrate, in accordance with an embodiment.

Figure 10:
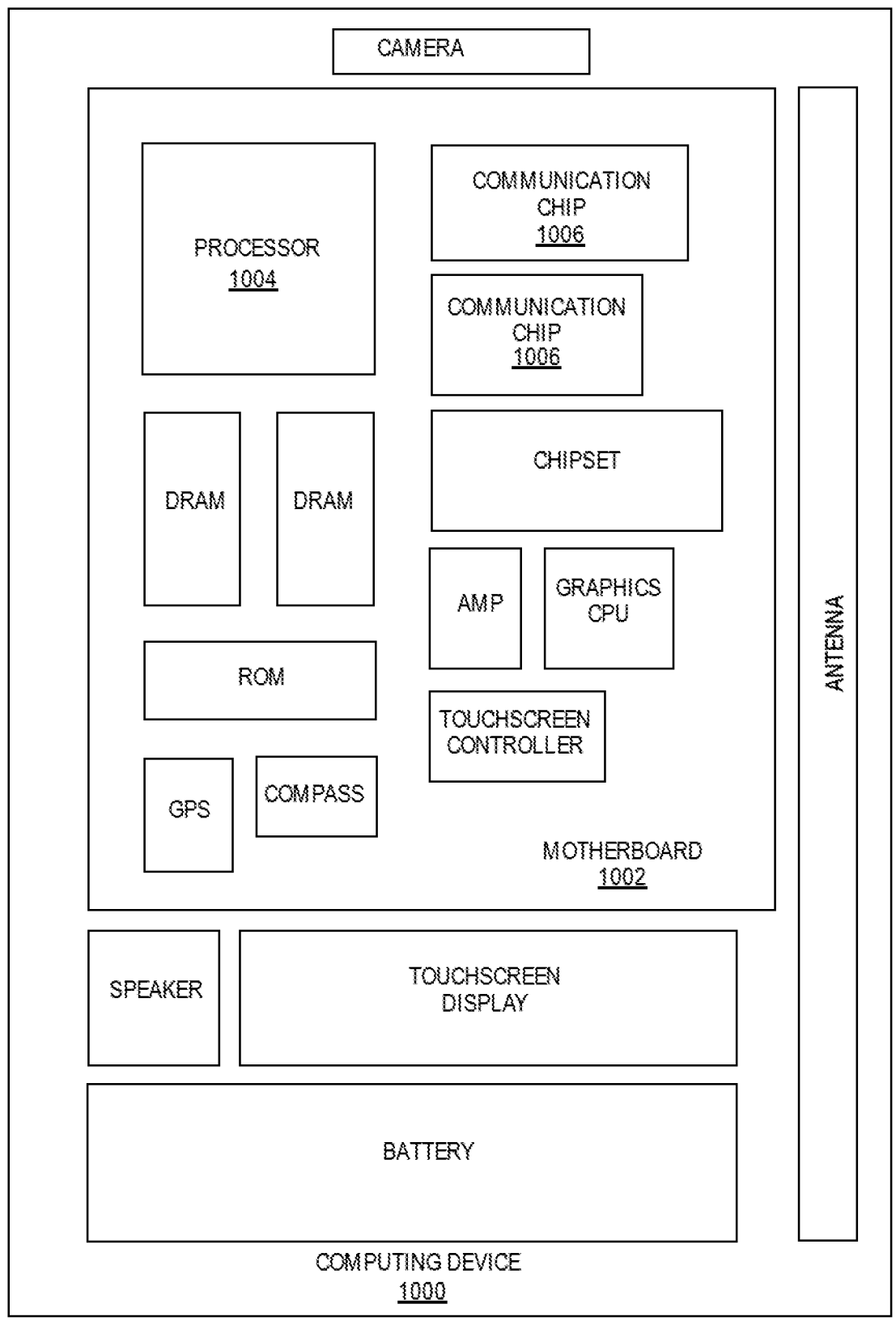

FIG. 10 is a schematic of a computing device built in accordance with an embodiment.

DESCRIPTION OF THE EMBODIMENTS

Embodiments described herein comprise structures that provide improved heat transfer away from inductors embedded in a package substrate. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, performance of integrated voltage regulators (IVRs) is currently limited by at least the operating temperature of the inductors (e.g., air core inductors (ACIs)) embedded in the package substrate. Particularly, there is currently no intentional low thermal resistance pathway between the inductors and a thermal solution, either in the top layer of the package substrate or in the bottom layer of the package substrate. Accordingly, embodiments disclosed herein include improvements to existing thermal pathways that lower the thermal resistance.

In one embodiment, the thermal pathway between the inductor and a thermal solution (e.g., a heat sink or the like) attached to the die is provided. Particularly, the cross-sectional area (in the XY-plane) of thermally conductive structures through the front-side layers of the package substrate are increased. For example, power bump (e.g., $V_{CC}$ bumps) may be grouped together and thermally coupled to the core layer of the package substrate by a plurality of vias and pads.

In an additional embodiment, an additional thermal pathway may be formed between the inductors and a board below the package substrate. Such an embodiment may be particularly beneficial since the thermal pathway does not pass through the die, thereby reducing the thermal load of the die as well. In some embodiments, the thermal pathway may include a magnetic block below the inductors. Such an embodiment may provide improved performance to the inductors due to improved thermal performance and by the modification of the magnetic field. In some embodiments, the thermal pathway may be a discrete component that is coupled between the electronics package and the board with solder bumps.

In yet another embodiment, a thermal sink may be coupled to the inductors. The thermal sink may also reduce the DC resistance of the inductors in addition to being used to alleviate thermally imposed maximum current limits of the inductors.

Figure 1:
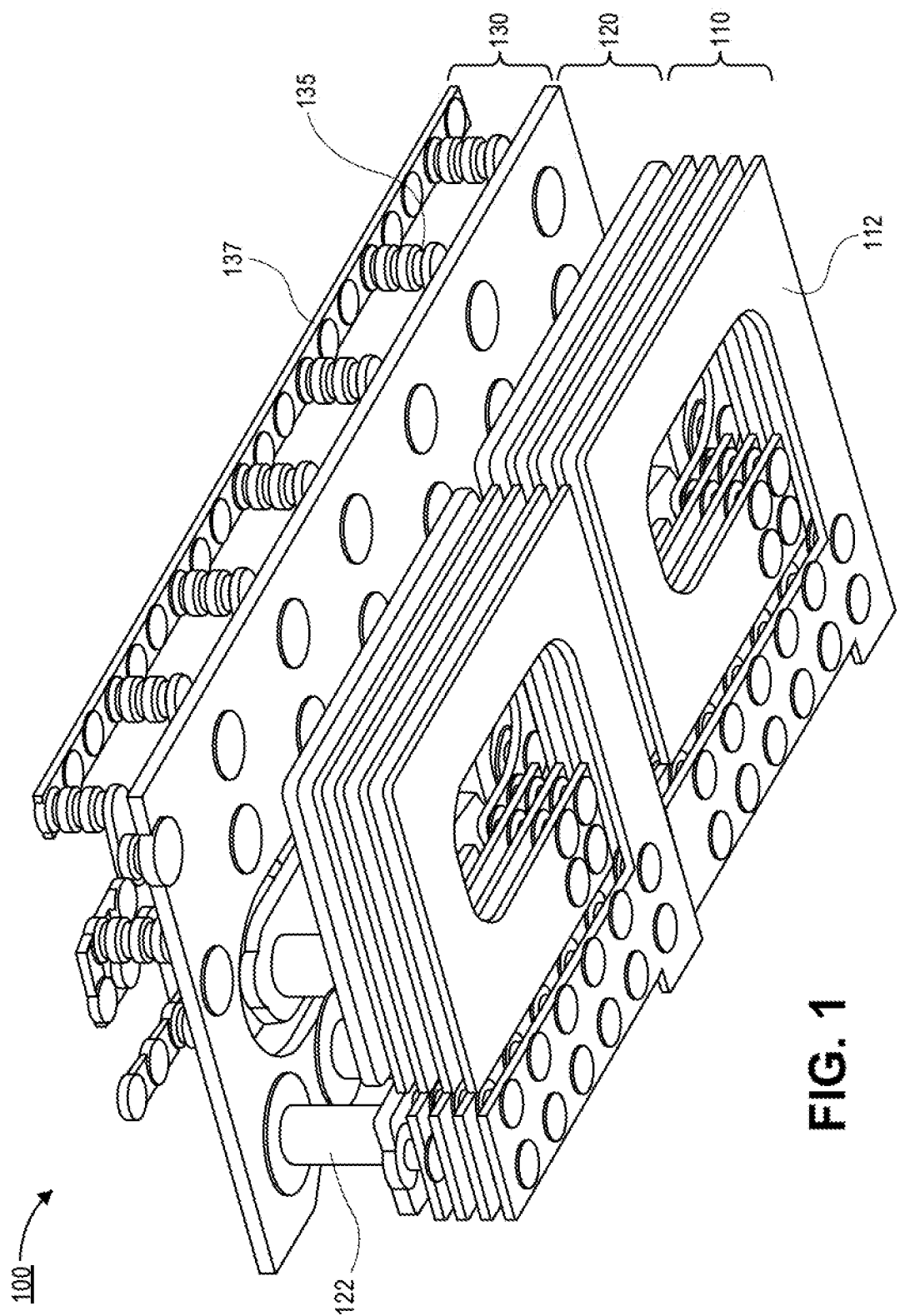
FIG. 1 is a perspective view illustration of the output power delivery package network of an integrated voltage regulator (IVR), in accordance with an embodiment.

Referring now to FIG. 1, a perspective illustration of an integrated voltage regulator (IVR) output network 100 is shown, in accordance with an embodiment. It is to be appreciated that the illustration shown in FIG. 1 omits the dielectric layers surrounding the conductive features in order to not obscure the figure. In an embodiment, a plurality of inductors 112 may be formed in backside layers 110 of the package. In an embodiment, each of the plurality of inductors 112 may comprise one or more conductive loops formed in one or more of the backside layers 110.

In an embodiment, the inductors 112 may be electrically coupled to through-core vias 122 that pass through a core layer 120 of the package substrate. In an embodiment, the through-core vias 122 may be electrically coupled to vias 135 that extend up through front-side package layers 130. In an embodiment pads 137 may be formed above the vias 135. Bumps (e.g., C4 bumps) (not shown in FIG. 1) for attaching a die may be formed on the pads 137.

The thermal pathway between the pads 137 and the inductors 112 is through the conductive features (i.e., the through core vias 122 and the vias 135) and organic material of the package (e.g., dielectric materials). Due to the high thermal resistance of dielectric materials, the thermal pathway has a high thermal resistance. Accordingly, embodiments include structures within the front-side layers that reduces the thermal resistance by providing a lower thermal resistance through a metallic path.

Figure 2A:
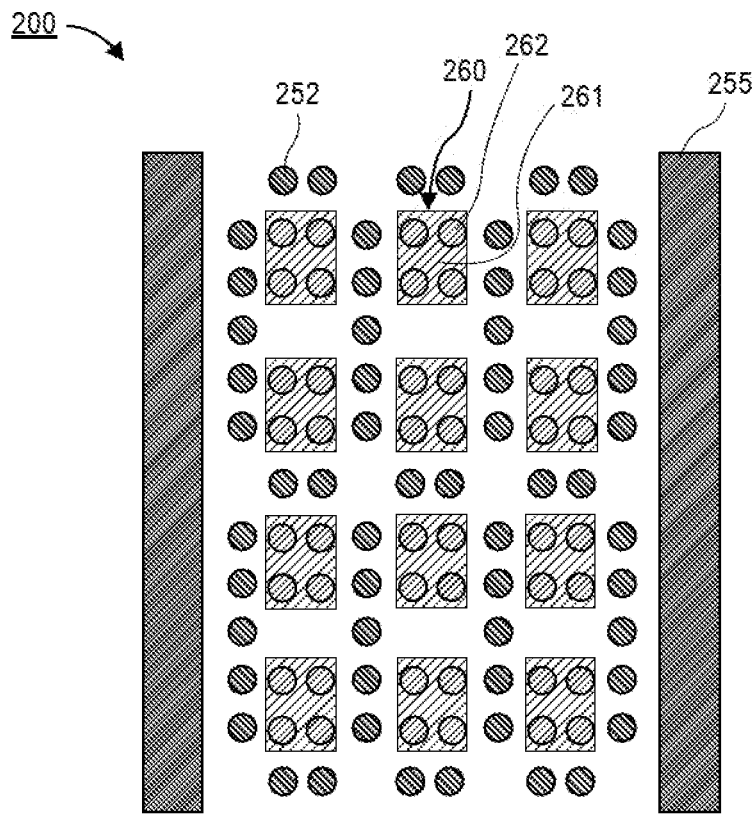
FIG. 2A is a plan view illustration of a top surface of a package with a plurality of power bump (e.g., $V_{CC}$ bumps) groups, where each of the power bumps in a group are connected in parallel by a plurality of vias and pads, in accordance with an embodiment.

Referring now to FIG. 2A a plan view illustration of a top surface of a package substrate 200 is shown, in accordance with an embodiment. In an embodiment, the package substrate 200 may include a plurality of bumps 252 and 262 (e.g., C4 bumps or the like). In an embodiment, the bumps 252 may be ground bumps (e.g., $V_{SS}$ bumps) and the bumps 262 may be power bumps (e.g., $V_{CC}$ bumps). In an embodiment, the bumps 252 and 262 may be formed between IVR physical circuits in die (i.e., IVR hard intellectual property (HIPs)) 255. In an embodiment, the power bumps (e.g., $V_{CC}$ bumps) 262 may be arranged in a plurality of groups 260. For example, in the illustrated embodiment, each group 260 comprises four power bumps (e.g., $V_{CC}$ bumps) 262 that are formed over a single pad 261.

Figure 2B:
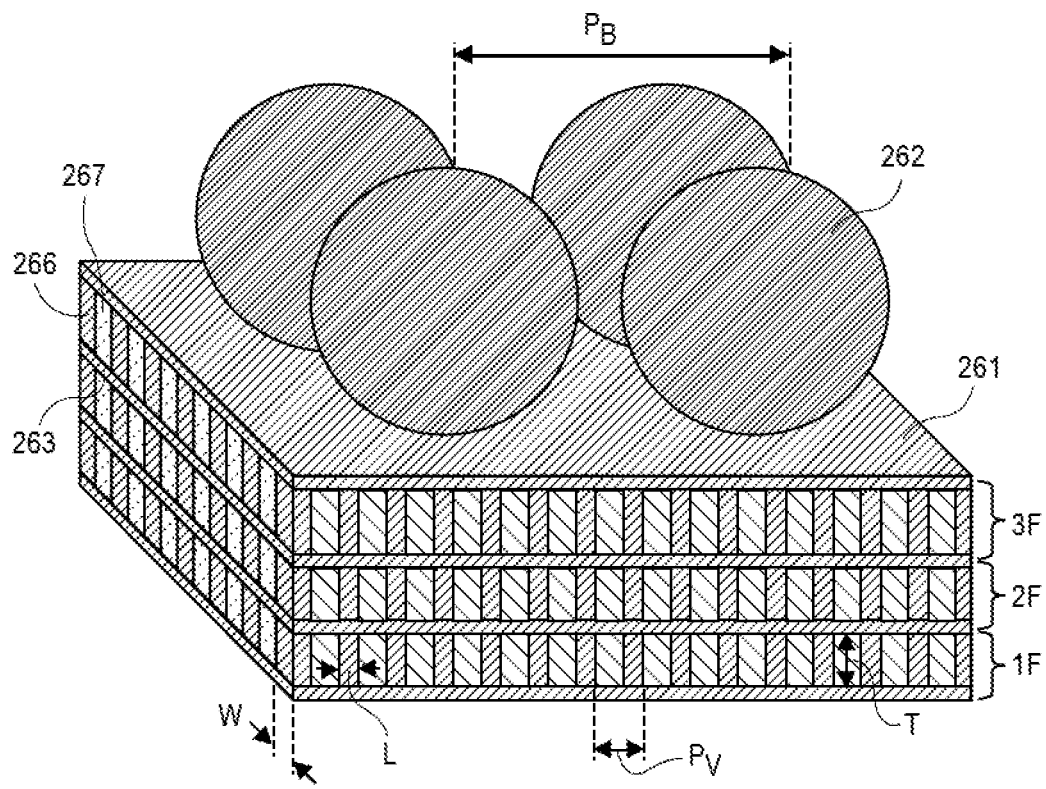
FIG. 2B is a perspective view illustration of a power bump (e.g., $V_{CC}$ bumps) group and front-side package layers that comprise a plurality of vias between the pads in each layer, in accordance with an embodiment.

Referring now to FIG. 2B, a perspective view illustration of a group of bumps 260 that illustrates the front-side package substrate layers (i.e., layers 1F-3F above the core layer) below the pad 261 is shown, in accordance with an embodiment. In the illustrated embodiment, three layers (i.e., 1F, 2F, and 3F) are shown below the pad 261. However, it is to be appreciated that embodiments include thermal paths below the pad 261 for any number of layers depending on the needs of the device. In an embodiment, each layer may comprise a conductive pad 263 and a dielectric layer 267 over the conductive pad 263. In an embodiment, each of the conductive pads 263 may be electrically and thermally coupled to each other and to the top pad 261 by a plurality of vias 266. That is, a plurality of vias 266 may be formed between pad 263 on different layers, and between the pad 263 on layer F3 and pad 261. The introduction of more vias 266 through paralleling of layers from the top pad 261 down to the core layer (not shown) increases the volume of thermally conductive material. As such, the thermal resistance is decreased and the inductors (not shown) are able to accommodate a higher current.

In an embodiment, the plurality of vias 266 may be lithographically defined vias. For example, sidewalls of the vias 266 may be substantially vertical, as opposed to tapered sidewalls that may be present in laser drilled vias. While embodiments disclosed herein explicitly include lithographically defined vias, it is to be appreciated that vias formed with other techniques may also be used (e.g., trench vias). In an embodiment, the plurality of vias 266 may be substantially uniform. For example, the vias 266 in the same layer may have substantially the same dimensions. In an embodiment, the vias 266 may have a width dimensions W and a length dimension L. In a particular embodiment, the width dimension W and the length dimension L may be substantially similar. For example, the length L and width W may both be smaller than the thickness T of each via 266. In an embodiment, the pitch $P_V$ of the vias 266 may be less than a pitch $P_B$ of the power bumps (e.g., $V_{CC}$ bumps) 262. Accordingly, in each group 260 there may be more vias 266 in each level of the package substrate than there are power bumps (e.g., $V_{CC}$ bumps) 262.

Figure 2C:
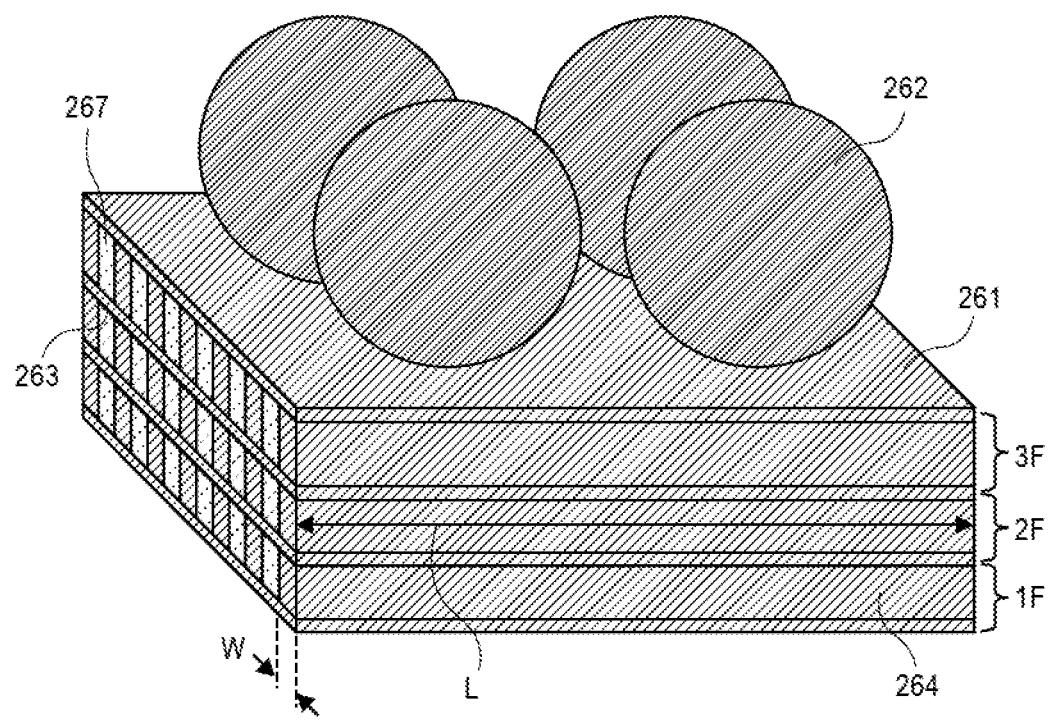
FIG. 2C is a perspective view illustration of a power bump (e.g., $V_{CC}$ bumps) group and front-side package layers that comprise a plurality of via lines between the pads in each layer, in accordance with an embodiment.

Referring now to FIG. 2C, a perspective view illustration of a group of bumps 260 with via lines 264 between the pads 261 and 263 is shown, in accordance with an embodiment. In an embodiment, the via lines 264 may extend through the dielectric layer 267 and may extend in length direction L. For example, the length L of each via line 264 may be greater than a width W of the via lines 264. In an embodiment, the length L of each via line 264 may be substantially equal to an edge length of the pads 261 and 263. In an embodiment, the via lines 264 may be formed with a lithographic process. While embodiments disclosed herein explicitly include lithographically defined via lines, it is to be appreciated that via lines formed with other techniques may also be used. The introduction of via lines 264 through multiple layers from the top pad 261 down to the core layer (not shown) increases the volume of thermally conductive material. As such, the thermal resistance is decreased and the inductors or some other hot package regions (not shown) are able to accommodate a higher current.

Furthermore, while explicit reference is made herein to the use of such thermal vias for heat transfer from inductors, it is to be appreciated that similar structures may be used to improve heat dissipation for other high temperature regions of a package. Since these dense small vias (e.g., micro-vias) can remove heat better compared to traditional package materials (e.g., dielectrics) they can also be used to remove heat from hot regions of the package due to higher current of some other load.

Figure 2D:
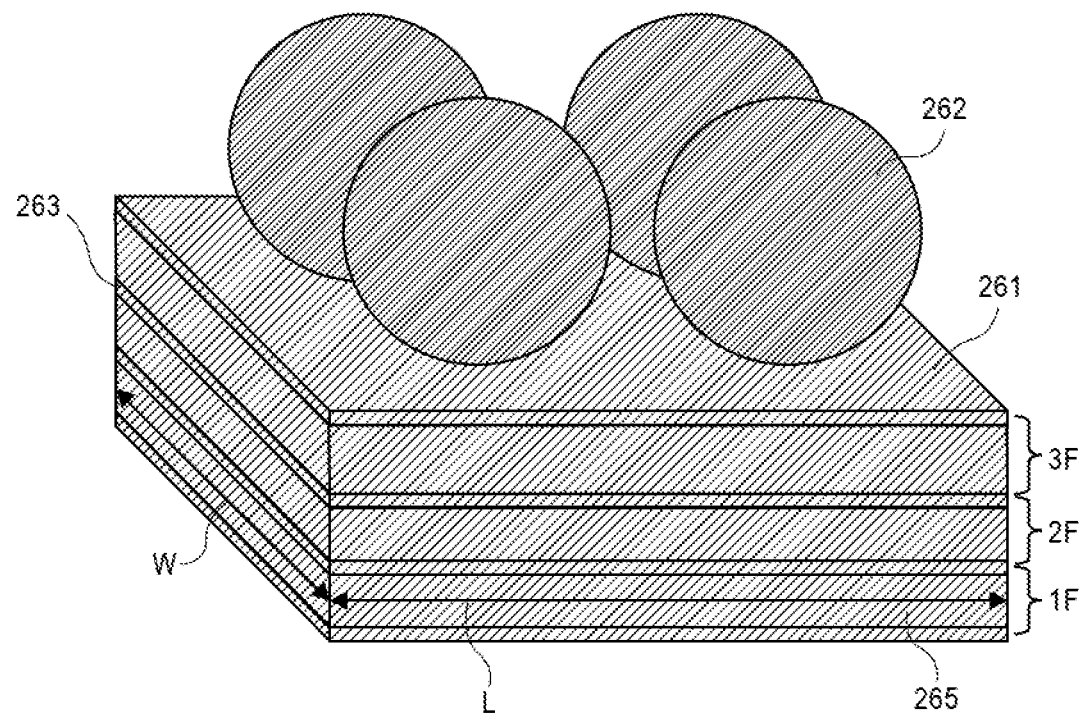
FIG. 2D is a perspective view illustration of a power bump (e.g., $V_{CC}$ bumps) group and front-side package layers that comprise a via block between the pads in each layer, in accordance with an embodiment.

Referring now to FIG. 2D, a perspective view illustration of a group of bumps 260 with a via block 265 between the pads 261 and 263 is shown, in accordance with an embodiment. In an embodiment, the via blocks 265 may extend through the dielectric layer and may extend in length direction L and a width direction W. In an embodiment, the length L and width W of each via block 265 may be substantially equal to edge lengths of the pads 261 and 263. In an embodiment, the via blocks 265 may be formed with a lithographic process. While embodiments disclosed herein explicitly include lithographically defined via blocks 256, it is to be appreciated that via blocks 256 may formed with other techniques may also be used. The introduction of via blocks 265 through multiple layers from the top pad 261 down to the core layer (not shown) increases the volume of thermally conductive material. As such, the thermal resistance is decreased and the inductors or some other hot package regions (not shown) are able to accommodate a higher current.

Figure 3:
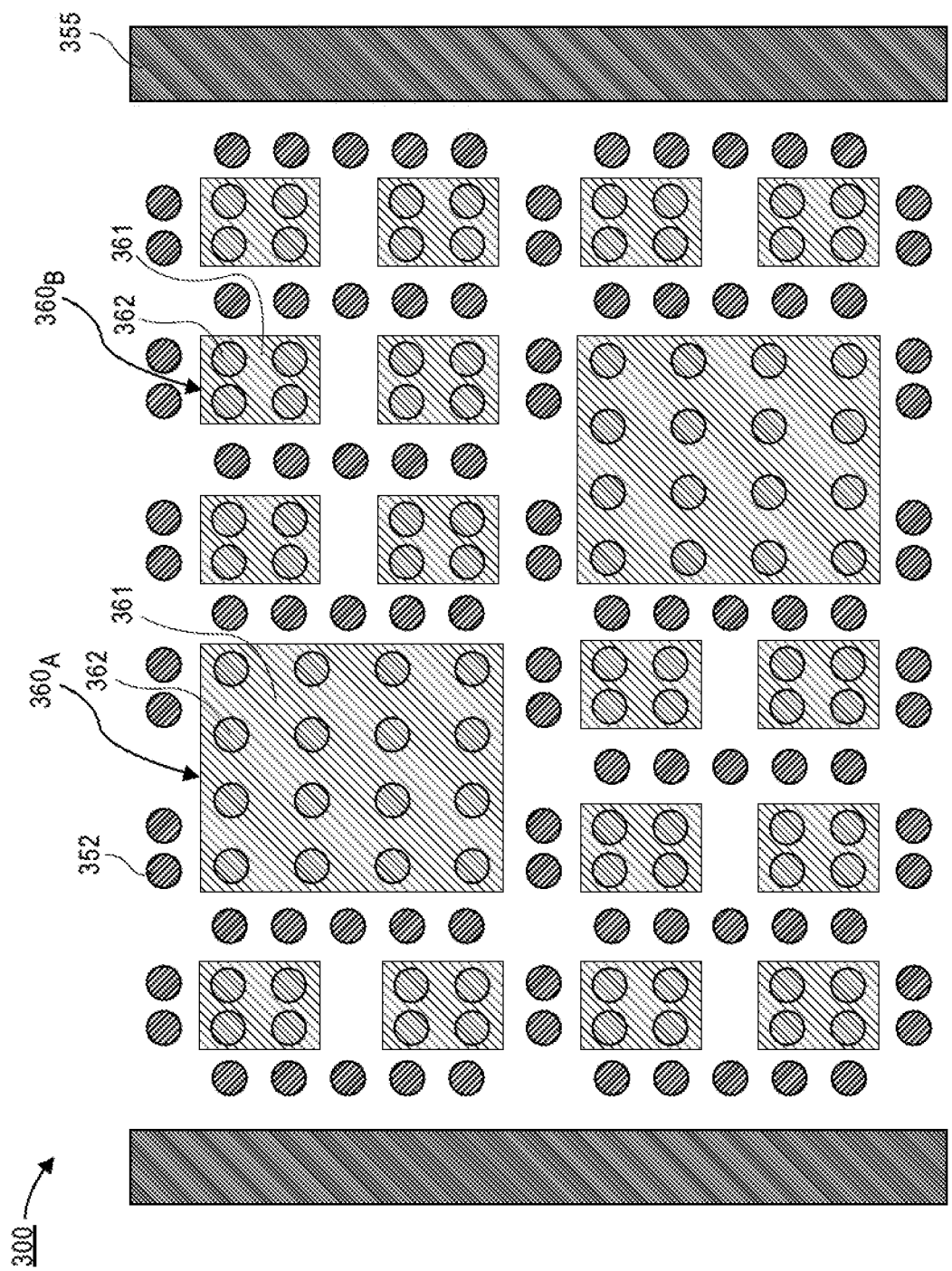
FIG. 3 is a plan view illustration of a top surface of a package with a plurality of power bump (e.g., $V_{CC}$ bumps) groups, where the power bump groups do not comprise the same number of bumps in each group, in accordance with an embodiment.

Referring now to FIG. 3, a plan view illustration of a top surface of an electronics package 300 is shown, in accordance with an additional embodiment. In an embodiment, the power domain is shown. For example, the power domain may comprise an IVR HIPs 355 and a plurality of ground bumps (e.g., $V_{SS}$ bumps) 352 and power bumps (e.g., $V_{CC}$ bumps) 362. In embodiment, the electronics package 300 may be substantially similar to the electronics package 200 described above, with the exception that a plurality of groups of bumps 360 are formed with non-uniform dimensions. For example, a first group of bumps $360_A$ may have more power bumps (e.g., $V_{CC}$ bumps) 362 on a single pad 361 than a second group of bumps $360_B$. Providing non-uniform group sizes allows for certain areas to provide greater heat transfer since there is more thermally conductive material in the region.

Figure 4:
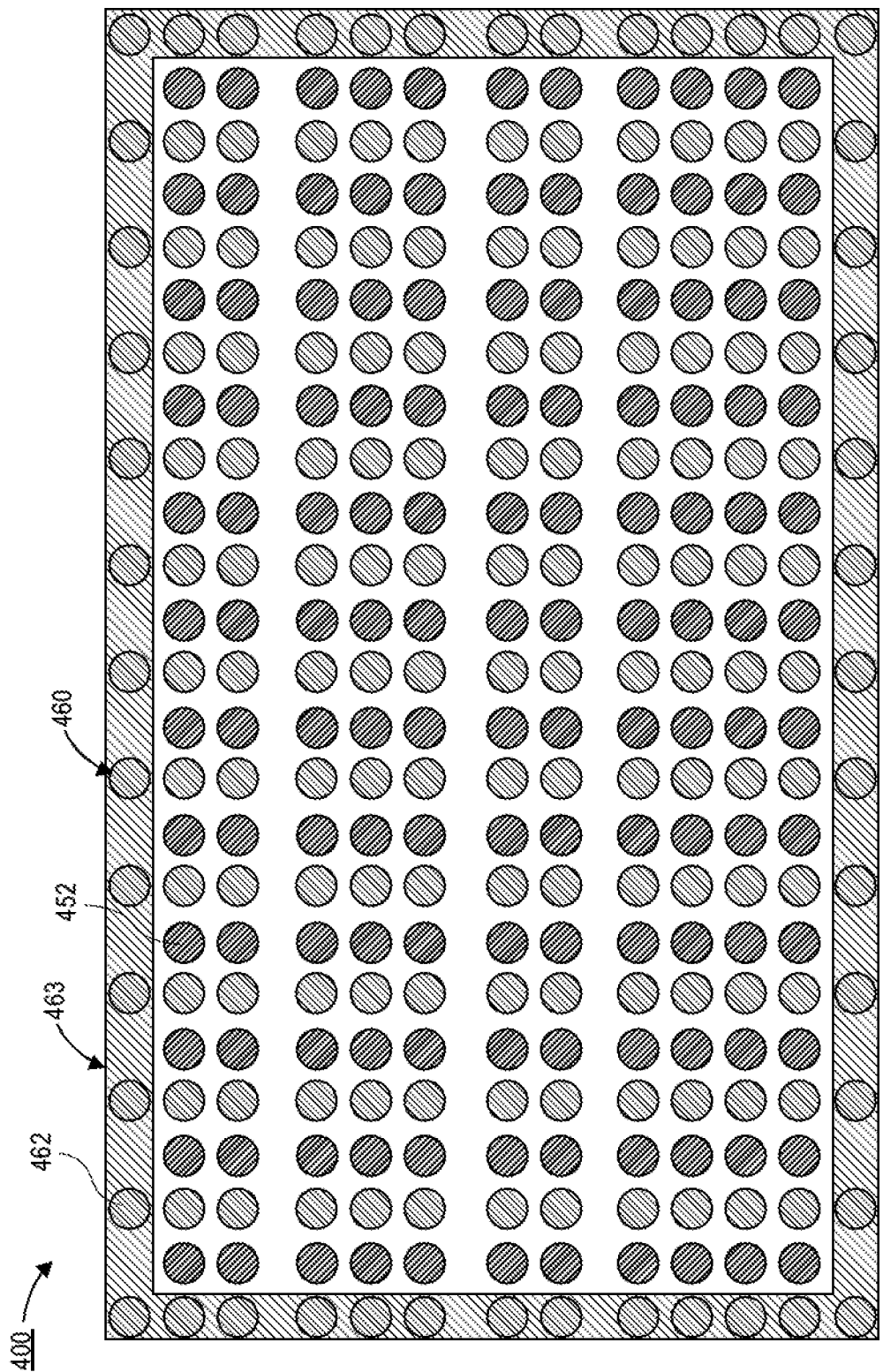
FIG. 4 is a plan view illustration of a top surface of a package with a power bump (e.g., $V_{CC}$ bumps) group that forms a ring around a power domain, in accordance with an embodiment.

Referring now to FIG. 4, a plan view illustration of a top surface of a package substrate 400 is shown, in accordance with an additional embodiment. In an embodiment, the package substrate 400 may comprise a power domain that includes a plurality of ground bumps (e.g., $V_{SS}$ bumps) 452 and a plurality of power bumps (e.g., $V_{CC}$ bumps) 462. In an embodiment, the package substrate 400 may be substantially similar to the package substrate 200 described above, except with respect to the configuration of the group 460 of power bumps (e.g., $V_{CC}$ bumps) 462. Particularly, embodiments may include a group of bumps 460 that form a perimeter around the power domain. In such embodiments, heat may be removed from the inductors or other hot package areas with vias (not shown) formed below a ring pad 463 that surrounds a plurality of ground bumps (e.g., $V_{SS}$ bumps) 452 and power bumps (e.g., $V_{CC}$ bumps) 462. The ring configuration may also provide electromagnetic interference (EMI) shielding.

In FIG. 4, the ring pad 463 is shown around the entire perimeter of the power domain of the electronics package 400. However, it is to be appreciated that similar rings may be formed around smaller portions of the package substrate 400. Additionally, while the ring pad 463 is shown as being a closed ring, it is to be appreciated that embodiments may also include pad rings 463 that are open. That is, embodiments include a pad 463 that has a first end and a second end that does not does not contact the first end.

Referring now to FIGS. 5A-5D, a series of plan view illustrations of top surfaces of package substrates 500 are shown, in accordance with additional embodiments. The package substrates 500 in each of the FIGS. 5A-5D may be substantially similar with the exception of the grouping and layout of the bumps 552 and 562. FIGS. 5A-5D provide additional examples of potential bump grouping patterns. However, it is to be appreciated that embodiments are not limited by the examples disclosed herein.

Referring now to FIG. 5A, a plan view illustration of a top surface of package substrate 500 is shown, in accordance with an embodiment. In an embodiment, the package substrate 500 may comprise IVR HIPs 555 on opposing edges of a power domain that includes a plurality of ground bumps (e.g., $V_{SS}$ bumps) 552 and a plurality of power bumps (e.g., $V_{CC}$ bumps) 562. In an embodiment, the ground bumps (e.g., $V_{SS}$ bumps) 552 and the power bumps (e.g., $V_{CC}$ bumps) 562 may be arranged in alternating columns. In an embodiment, the power bumps (e.g., $V_{CC}$ bumps) 562 may arranged in a plurality of groups 560. In an embodiment, the groups 560 may each comprise linear columns of power bumps (e.g., $V_{CC}$ bumps) 562 where each of the power bumps (e.g., $V_{CC}$ bumps) 562 in the group 560 are formed over a single pad 561. In an embodiment, the groups 560 may include power bumps (e.g., $V_{CC}$ bumps) 562 that are arranged in columns that are substantially parallel to the length of the IVR HIPs 555.

Referring now to FIG. 5B, a plan view illustration of a top surface of package substrate 500 is shown, in accordance with an embodiment. In an embodiment, the package substrate 500 may comprise IVR HIPs 555 on opposing edges of a power domain that includes a plurality of ground bumps (e.g., $V_{SS}$ bumps) 552 and a plurality of power bumps (e.g., $V_{CC}$ bumps) 562. In an embodiment, the power bumps (e.g., $V_{CC}$ bumps) 562 may be arranged in a plurality of groups 560. In an embodiment, the groups 560 each may comprise a plurality of power bumps (e.g., $V_{CC}$ bumps) 562 where each of the power bumps (e.g., $V_{CC}$ bumps) 562 in the group 560 are formed over a single pad 561. In an embodiment, the ground bumps (e.g., $V_{SS}$ bumps) 552 may also be arranged in a plurality of groups 550. In an embodiment, the groups 550 each may comprise a plurality of bumps 552 where each of the bumps 552 are formed over a single pad 551. In an embodiment, the groups 550 and 560 may have substantially the same dimensions and number of bumps in each group. Such an embodiment may be particularly optimized to facilitate die capacitance sharing and thermal conduction simultaneously.

Referring now to FIG. 5C, a plan view illustration of a top surface of package substrate 500 is shown, in accordance with an embodiment. In an embodiment, the package substrate 500 may comprise IVR HIPs 555 on opposing edges of a power domain that includes a plurality of ground bumps (e.g., $V_{SS}$ bumps) 552 and a plurality of power bumps (e.g., $V_{CC}$ bumps) 562. In an embodiment, the ground bumps (e.g., $V_{SS}$ bumps) 552 and the power bumps (e.g., $V_{CC}$ bumps) 562 may be arranged in alternating rows that extend in a direction perpendicular to the IVR HIPs 555. In an embodiment, the power bumps (e.g., $V_{CC}$ bumps) 562 may comprise a plurality of groups 560. In an embodiment, the groups 560 may comprise rows of power bumps (e.g., $V_{CC}$ bumps) 562 where each of the power bumps (e.g., $V_{CC}$ bumps) 562 in the group 560 are formed over a single pad 561. While the groups 560 are referred to explicitly with respect to the location of the IVR HIPs 555, it is to be appreciated that the IVR HIPs 555 may optionally be located in other locations of the package substrate 500.

Referring now to FIG. 5D, a plan view illustration of a top surface of package substrate 500 is shown, in accordance with an embodiment. In an embodiment, the package substrate 500 may comprise IVR HIPs 555 on opposing edges of a power domain that includes a plurality of ground bumps (e.g., $V_{SS}$ bumps) 552 and a plurality of power bumps (e.g., $V_{CC}$ bumps) 562. In an embodiment, the power bumps (e.g., $V_{CC}$ bumps) 562 may be arranged in a plurality of groups 560. In an embodiment, the groups 560 each may comprise a plurality of power bumps (e.g., $V_{CC}$ bumps) 562 where each of the power bumps (e.g., $V_{CC}$ bumps) 562 in the group 560 are formed over a single pad 561. In an embodiment, the ground bumps (e.g., $V_{SS}$ bumps) 552 may also be arranged in a plurality of groups 550. In an embodiment, the groups 550 each may comprise a plurality of ground bumps (e.g., $V_{SS}$ bumps) 552 where each of the ground bumps (e.g., $V_{SS}$ bumps) 552 are formed over a single pad 551. In an embodiment, the groups 550 and 560 may have different dimensions and/or shapes. For example, in FIG. 5D the pads 551 are diamond shaped, whereas the pads 561 are circular. In an embodiment, the number of bumps 552/562 in each group 550/560 may be uniform, or the groups 550/560 may have different numbers of bumps 552/562.

Referring now to FIGS. 6A-8B, illustrations that depict thermal solutions that are located on the backside layers of the package substrate are shown, in accordance with various embodiments.

Referring now to FIGS. 6A and 6B, a plan view illustration of a bottom surface of the backside layers 610 of the package substrate and a cross-sectional illustration of the backside layers 610 and a board 690 are shown, respectively, in accordance with an embodiment. In an embodiment, the plan view illustration in FIG. 6A illustrates a pair of inductor loops $612_A$ and $612_B$ that are electrically coupled to a cold bar 605. In an embodiment, the inductor loops $612_A$ and $612_B$ may be embedded in backside dielectric layers 613. For example, in the cross-sectional illustration in FIG. 6B, the inductor loops $612_A$ and $612_B$ each comprise a plurality of loops $615_1$-$615_n$ embedded in the backside dielectric layers 613. In an embodiment, each of the loops $615_1$-$615_n$ may have substantially uniform thickness. In other embodiments, the loops $615_1$-$615_n$ may have non-uniform thicknesses. For example, in FIG. 6B the uppermost loop $615_n$ is shown as having a thickness that is greater than the thicknesses of other loops $615_1$ and $615_2$. In an embodiment, the loops $615_1$-$615_n$ may be coupled by vias (not shown in the cross-section in FIG. 6B).

In an embodiment, a magnetic block 611 may be positioned between the inductors $612_A$ and $612_B$ and a bottom layer 607 of package 610. In an embodiment, pads 608 surrounded by solder resist 618 and solder bumps 609 may thermally couple the magnetic block 611 to the board 690. In an embodiment, the board 690 may comprise pads 691 for receiving the solder bumps 609 and conductive layer 692. In an embodiment, the board 690 may also comprise a solder resist layer 693. Accordingly, a thermal path from the bottom of the inductors $612_A$ and $612_B$ to the board 690 is provided. The heat may then travel laterally along the conductive layer 692 to the edge of the board 690 and/or in the Z-direction to lower layers (not shown) of the board 690. In an embodiment, the magnetic block 611 may have a low enough electrical conductance that no explicit insulator is required to prevent shorting.

The use of a magnetic block provides additional benefits beyond thermal performance. Particularly, the presence of the magnetic block 611 below the inductors $612_A$ and $612_B$ facilitates the magnetic field 619 of each inductor $612_A$ and $612_B$ to curve horizontally and prevents normal impingement on the conductive layer 607 below the inductors $612_A$ and $612_B$. As such, the quality factor of the inductor is improved. Furthermore, since part of the magnetic field is present in a high permeability material (i.e., the magnetic block 611) the inductance is increased. Alternatively, for the same inductance, the DC resistance may be reduced by shrinking the void area 621 and increasing the widths for the inductor turns 615. Furthermore, when the conductive layer 607 is coupled to a ground voltage, EMI shielding is also provided and electrical performance is improved.

In the embodiment described above with respect to FIGS. 6A and 6B, the magnetic block 611 may be fabricated as an integral part of the package substrate 610. However, in some embodiments the thermal pathway may be a discrete component that is fabricated separately from the package substrate 610. Such embodiments may allow for simplified manufacturing, as the thermal pathway may be mounted to the package substrate 610 with solder bumps similar to the assembly of other discrete components (e.g., capacitors or the like). Such an embodiment is described in greater detail with respect to FIG. 7.

Referring now to FIG. 7, a cross-sectional illustration of the backside layers 710 of a package substrate and a discrete thermal pathway 780 between the inductors 712 and a board 790 is shown, in accordance with an embodiment. In an embodiment, the backside layers 710 may be substantially similar to the backside layers 610 described with respect to FIGS. 6A and 6B, with the exception that the thermal pathway 780 is a discrete component. For example, the backside layers 710 of the package substrate may comprise inductors $712_A$ and $712_B$ that are coupled to a cold bar 705 and vias 706. In an embodiment, the inductors $712_A$ and $712_B$ may be embedded in backside dielectric layers 713. Additionally, the board 790 may be substantially similar to the board 690 described above with respect to FIG. 6B. For example, the board 790 may comprise a solder resist layer 793 over a conductive layer 792. Pads 791 for receiving solder balls 709 may also be included on the board 790.

In an embodiment, the thermal pathway 780 may comprise a thermal block 711 and a conductive layer 707. In an embodiment, the thermal block 711 may be deposited on the conductive layer 707 prior to being attached to the backside layers 710 of the package substrate. In an embodiment, the thermal pathway 780 may be coupled to the backside layer 710 with solder bumps 773 or the like. In an embodiment, the solder bumps 773 may be attached to pads 772. In an embodiment, the pads 772 may be maintained at ground potential. As such, the conductive layer 707 may also provide EMI shielding, similar to the embodiment described above with respect to FIG. 6B. In an embodiment, the thermal block 711 may be in direct contact with a surface of the inductors $712_A$ and $712_B$. For example, the thermal block 711 may contact a bottom loop $715_1$ of the inductors $712_A$ and $712_B$.

In an embodiment, the thermal block 711 may be a magnetic material. In such embodiments, benefits to electrical performance (e.g., increased inductance and/or reduced DC resistance) may also be obtained, similar to the embodiments described above with respect to FIG. 6B. Additionally, since the magnetic material of the thermal block 711 is deposited on a discrete thermal pathway 780, the assembly tools and/or processes flows used to fabricate the package substrate do not need to be altered.

Furthermore, it is to be appreciated that other materials may also be used to form the thermal block 711 other than magnetic materials. For example, ceramics filled with thermally conductive particles, and/or the like may be used to provide a thermal pathway between the inductors $712_A$ and $712_B$ and the board 790. The use of non-magnetic materials may not provide the same improvement to the electrical performance of the device, but the substitution of non-magnetic materials for the thermal block 711 may be a cost effective design choice depending on the needs of the device.

In an embodiment, the thermal pathway 780 may be attached to the board 790 with solder bumps 709 or the like. Since the thermal pathway 780 is a discrete component, the stand-off distance between the bottom surface of the backside layers 710 and the board 790 and the stand-off distance between the bottom surface of the thermal pathway 780 and the board 790 may not be uniform. As such, embodiments may include first bumps 774 that couple the backside layers 710 to the board and second bumps 709 that couple the thermal pathway 780 to the board 790. In an embodiment the first bumps 774 may have a first height $H_1$ that is greater than a second height $H_2$ of the bumps 709.

In yet another embodiment, the thermal performance of the electronics package may be improved by adding a thermal sink directly to the inductors. An example of such an embodiment is described with respect to FIGS. 8A and 8B.

Referring now to FIGS. 8A and 8B, a plan view illustration of the bottom of the backside layers 810 of a package substrate and a cross-sectional illustration of the backside layers 810 are shown, respectively, in accordance with an embodiment. In an embodiment, the backside layer 810 may be substantially similar to the backside layers 610 described above with respect to FIGS. 6A and 6B, with the exception that the inductors $812_A$ and $812_B$ further comprise a thermal sink 883. For example, the backside layers 810 of the package substrate may comprise inductors $812_A$ and $812_B$ that are coupled to a cold bar 805 and vias 806. In an embodiment, the inductors $812_A$ and $812_B$ may be embedded in backside dielectric layers 813.

In an embodiment, the thermal sink 883 may have a pattern that matches the outline of the inductors $812_A$ and $812_B$. As shown in FIG. 8B, sidewalls of the thermal sink 883 may be substantially coplanar with sidewalls of the bottom loop $815_1$. By forming the thermal sink 883 with the same pattern as the inductors $812_A$ and $812_B$, the thermal sink 883 may also serve as an extension of the inductor $812_A$ and $812_B$ and reduce DC resistance. In an embodiment the inductors $812_A$ and $812_B$ may be a first conductive material and the thermal sink 883 may be a second conductive material. In an embodiment, the second conductive material may have a thermal capacity that is greater than a thermal capacity of the first conductive material. For example, the first conductive material may be copper and the second conductive material may be aluminum. In an embodiment, the thermal sink 883 may be attached to the inductors $812_A$ and $812_B$ with a thermal adhesive and extend past a surface of the solder mask 818. In an embodiment, the thermal sink 883 may have a thickness that is 10 µm or greater, 25 µm or greater, 50 µm or greater or 100 µm or greater.

Referring now to FIG. 9, a cross-sectional illustration of a packaged system 900 is shown, in accordance with an embodiment. In an embodiment, the packaged system 900 may include a die 940 electrically coupled to a package substrate 901 with solder bumps 943. The package substrate 901 may be electrically coupled to a board 990, such as a printed circuit board (PCB) with solder bumps 909 or any other suitable interconnect architecture.

In an embodiment, an inductor 912 similar to embodiments described above may be integrated into the package substrate 901. Embodiments include any number of inductors 912 formed into the package substrate 901. For example, a plurality of inductors 912 may be integrated into the circuitry of the package substrate 901 for power management, filtering, or any other desired use.

In an embodiment, the plurality of inductors 912 may be thermally coupled to a thermal solution 942 (e.g., an integrated heat spreader (IHS), or the like) that is attached to the die 940. For example, the inductors 912 may be thermally coupled to thermal solution 942 by a plurality of vias and pads (not shown) that form part of bump groups in the front side layers of the package substrate 901, similar to what is described above with respect to FIGS. 2A-5D.

In an additional embodiment, the plurality of inductors 912 may be thermally coupled to the board 990 by a thermal pathway (not shown) similar to what is described above with respect to FIGS. 6A-7. For example, the thermal pathway may be integrated into the package substrate 901 (similar to what is shown in the embodiment illustrated in FIG. 6B) or the thermal pathway may be a discrete component attached to the package substrate 901 (similar to what is shown in the embodiment illustrated in FIG. 7).

In yet another embodiment, the inductors 912 may be thermally coupled to a thermal sink (not shown). For example, the thermal sink may be attached to the inductors 912 and extend out past a backside surface of the package substrate 901 (similar to what is shown in the embodiment illustrated with respect to FIGS. 8A and 8B).

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor may be thermally coupled to inductors embedded in an organic package substrate by a thermal pathway through front-side layers of the organic package substrate, in accordance with embodiments described herein. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip may be thermally coupled to inductors embedded in an organic package substrate by a thermal pathway through front-side layers of the organic package substrate, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: An electronics package, comprising: a package substrate, wherein the package substrate comprises: a plurality of backside layers; a plurality of front-side layers; and a core layer between the plurality of backside layers and the plurality of front-side layers; an inductor embedded in the plurality of backside layers; and a plurality of bumps over the front-side layers and thermally coupled to the inductor, wherein the plurality of bumps are thermally coupled to the core layer by a plurality of vias.

Example 2: the electronics package of Example 1, wherein the plurality of front-side layers each comprise a conductive pad and a dielectric layer, and wherein the pads are thermally coupled to each other by the plurality of vias that pass through the dielectric layers.

Example 3: the electronics package of Example 1 or Example 2, wherein the plurality of bumps comprise a first group of bumps that are electrically in parallel and adjacent to each other, and wherein the first group of bumps are positioned on an isolated first pad.

Example 4: the electronics package of Examples 1-3, wherein the plurality of bumps further comprise a second group of bumps that are electrically in parallel and adjacent to each other, and wherein the second group of bumps are positioned on an isolated second pad.

Example 5: the electronics package of Examples 1-4, wherein the first group of bumps comprises a different number of bumps than the second group of bumps.

Example 6: the electronics package of Examples 1-5, wherein the first group of bumps form a ring around a power domain of the electronics package.

Example 7: the electronics package of Examples 1-6, wherein the plurality of vias have a width dimension that is not substantially equal to a length dimension.

Example 8: the electronics package of Examples 1-7, wherein the plurality of vias are merged to form a block between each of the front-side layers.

Example 9: the electronics package of Examples 1-8, wherein a second plurality of vias are merged to form a block between one or more of the backside layers.

Example 10: the electronics package of Examples 1-9, wherein the plurality of vias are merged to form a block between each of the front-side layers, and wherein a second plurality of vias are merged to form a block between one or more of the backside layers.

Example 11: the electronics package of Examples 1-10, wherein the bumps are coupled to a die.

Example 12: the electronics package of Examples 1-11, wherein the die is thermally coupled to a heat sink.

Example 13: the electronics package of Examples 1-12, wherein the inductor is thermally coupled to the heat sink by the plurality of vias and the plurality of bumps.

Example 14: the electronics package of Examples 1-13, further comprising a power domain that does not comprise an inductor, and a second plurality of bumps over the front-side layers and thermally coupled to the power domain by vias.

Example 15: the electronics package, comprising: a package substrate, wherein the package substrate comprises: a plurality of backside layers; a plurality of front-side layers; and a core layer between the plurality of backside layers and the plurality of front-side layers; an inductor embedded in the plurality of backside layers; and a thermal path below the inductor.

Example 16: the electronics package of Example 15, wherein the thermal path comprises a magnetic block.

Example 17: the electronics package of Example 15 or Example 16, wherein the magnetic block separates a ground plane from the inductor.

Example 18: the electronics package of Examples 15-17, wherein the thermal path is coupled to a backside layer of the electronics package with solder balls.

Example 19: the electronics package of Examples 15-18, wherein the thermal path comprises a non-magnetic block.

Example 20: the electronics package of Examples 15-19, wherein the electronics package is coupled to a board, and wherein solder balls between a backside layer and the board have a first height, and wherein solder balls between the thermal path and the board have a second height, wherein the second height is less than the first height.

Example 21: the electronics package of Examples 15-20, wherein the thermal pathway is coupled to a board.

Example 22: the electronics package of Examples 15-21, wherein the inductor is thermally coupled to the board.

Example 23: an electronics package, comprising: a package substrate, wherein the package substrate comprises: a plurality of backside layers; a plurality of front-side layers; and a core layer between the plurality of backside layers and the plurality of front-side layers; an inductor embedded in the plurality of backside layers, wherein the inductor comprises a first conductive material; and a thermal sink attached to the inductor, wherein the thermal sink is a second conductive material that is different than the first conductive material.

Example 24: the electronics package of Example 23, wherein edges of the thermal sink are coplanar with edges of the inductor.

Example 25: the electronics package of Example 23 or Example 24, wherein the second conductive material has a thermal capacity that is greater than a thermal capacity of the first conductive material.

Example 26: the electronics package of Examples 23-25, wherein the first conductive material comprises copper and wherein the second conductive material comprises aluminum.

What is claimed is:

1. An electronics package, comprising:
a package substrate, wherein the package substrate comprises:
a plurality of backside layers;
a plurality of front-side layers; and
a core layer between the plurality of backside layers and the plurality of front-side layers;
an inductor embedded in the plurality of backside layers; and
a plurality of bumps over the front-side layers and thermally coupled to the inductor, wherein the plurality of bumps are thermally coupled to the core layer by a plurality of vias.

2. The electronics package of claim 1, wherein the plurality of front-side layers each comprise a conductive pad and a dielectric layer, and wherein the pads are thermally coupled to each other by the plurality of vias that pass through the dielectric layers.

3. The electronics package of claim 2, wherein the plurality of bumps comprise a first group of bumps that are electrically in parallel and adjacent to each other, and wherein the first group of bumps are positioned on an isolated first pad.

4. The electronics package of claim 3, wherein the plurality of bumps further comprise a second group of bumps that are electrically in parallel and adjacent to each other, and wherein the second group of bumps are positioned on an isolated second pad.

5. The electronics package of claim 4, wherein the first group of bumps comprises a different number of bumps than the second group of bumps.

6. The electronics package of claim 3, wherein the first group of bumps form a ring around a power domain of the electronics package.

7. The electronics package of claim 1, wherein the plurality of vias have a width dimension that is not substantially equal to a length dimension.

8. The electronics package of claim 1, wherein the plurality of vias are merged to form a block between each of the front-side layers.

9. The electronics package of claim 1, wherein a second plurality of vias are merged to form a block between one or more of the backside layers.

10. The electronics package of claim 1, wherein the plurality of vias are merged to form a block between each of the front-side layers, and wherein a second plurality of vias are merged to form a block between one or more of the backside layers.

11. The electronics package of claim 1, wherein the bumps are coupled to a die.

12. The electronics package of claim 11, wherein the die is thermally coupled to a heat sink.

13. The electronics package of claim 12, wherein the inductor is thermally coupled to the heat sink by the plurality of vias and the plurality of bumps.

14. The electronics package of claim 1, further comprising a power domain that does not comprise an inductor, and a second plurality of bumps over the front-side layers and thermally coupled to the power domain by vias.

15. An electronics package, comprising:
a package substrate, wherein the package substrate comprises:
a plurality of backside layers;
a plurality of front-side layers; and
a core layer between the plurality of backside layers and the plurality of front-side layers;
an inductor embedded in the plurality of backside layers; and
a thermal path below the inductor, wherein the thermal path is coupled to a backside layer of the electronics package with solder balls.

16. The electronics package of claim 15, wherein the thermal path comprises a magnetic block.

17. The electronics package of claim 16, wherein the magnetic block separates a ground plane from the inductor.

18. The electronics package of claim 15, wherein the thermal path comprises a non-magnetic block.

19. The electronics package of claim 15, wherein the electronics package is coupled to a board, and wherein solder balls between a backside layer and the board have a first height, and wherein solder balls between the thermal path and the board have a second height, wherein the second height is less than the first height.

20. The electronics package of claim 15, wherein the thermal pathway is coupled to a board.

21. The electronics package of claim 20, wherein the inductor is thermally coupled to the board.

22. An electronics package, comprising:
a package substrate, wherein the package substrate comprises:
a plurality of backside layers;
a plurality of front-side layers; and
a core layer between the plurality of backside layers and the plurality of front-side layers;
an inductor embedded in the plurality of backside layers; and
a thermal path below the inductor, wherein the thermal path comprises a magnetic block.

23. An electronics package, comprising:
a package substrate, wherein the package substrate comprises:
a plurality of backside layers;
a plurality of front-side layers; and
a core layer between the plurality of backside layers and the plurality of front-side layers;
an inductor embedded in the plurality of backside layers, wherein the inductor comprises a first conductive material; and a thermal sink attached to the inductor, wherein the thermal sink is a second conductive material that is different than the first conductive material.

24. The electronics package of claim 23, wherein edges of the thermal sink are coplanar with edges of the inductor.

25. The electronics package of claim 23, wherein the second conductive material has a thermal capacity that is greater than a thermal capacity of the first conductive material.

\* \* \* \* \*